United States Patent
Maul

(10) Patent No.: US 9,720,327 B2
(45) Date of Patent: Aug. 1, 2017

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventor: Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 173 days.

(21) Appl. No.: 14/721,426

(22) Filed: May 26, 2015

(65) Prior Publication Data

US 2015/0253677 A1    Sep. 10, 2015

Related U.S. Application Data

(63) Continuation of application No. PCT/EP2013/075383, filed on Dec. 3, 2013.
(Continued)

(30) Foreign Application Priority Data

Dec. 14, 2012    (DE) .................. 10 2012 223 233

(51) Int. Cl.
*G03B 27/42* (2006.01)
*G03F 7/20* (2006.01)
(Continued)

(52) U.S. Cl.
CPC ....... *G03F 7/70191* (2013.01); *G02B 5/3075* (2013.01); *G02B 17/06* (2013.01);
(Continued)

(58) Field of Classification Search
CPC .............. G03F 7/70191; G03F 7/70033; G03F 7/70075; G03F 7/702; G03F 7/70058;
(Continued)

(56) References Cited

U.S. PATENT DOCUMENTS 6,137,618 A    10/2000    Herzinger ................. 359/245
6,208,463 B1    3/2001    Hansen et al.
(Continued)

FOREIGN PATENT DOCUMENTS

CN    1307689 A    8/2001
CN    1670565 A    9/2005
(Continued)

OTHER PUBLICATIONS

Chinese Office Action and Search Report for corresponding CN Appl No. 201380065563.2, dated Jul. 21, 2016.
(Continued)

*Primary Examiner* — Mesfin Asfaw
(74) *Attorney, Agent, or Firm* — Fish & Richardson P.C.

(57) ABSTRACT

The invention relates to an optical system of a microlithographic projection exposure apparatus, in particular for operation in the EUV, comprising a mirror arrangement composed of a plurality of mutually independently adjustable mirror elements, and at least one polarization-influencing arrangement arranged upstream of the mirror arrangement relative to the light propagation direction, wherein the polarization-influencing arrangement has a group of first reflection surfaces and a group of second reflection surfaces, wherein the first reflection surfaces are tiltable independently of one another, and wherein, during the operation of the optical system, light reflected at respectively one of the first reflection surfaces can be directed onto the mirror arrangement via respectively a different one of the second reflection surfaces depending on the tilting of the first reflection surface.

26 Claims, 5 Drawing Sheets

Related U.S. Application Data

(60) Provisional application No. 61/737,153, filed on Dec. 14, 2012.

(51) Int. Cl.
*G02B 17/06* (2006.01)
*G02B 27/28* (2006.01)
*G02B 5/30* (2006.01)

(52) U.S. Cl.
CPC .............. *G02B 27/28* (2013.01); *G03F 7/702* (2013.01); *G03F 7/70116* (2013.01); *G03F 7/70566* (2013.01); *G02B 5/3091* (2013.01)

(58) Field of Classification Search
CPC .... G03F 7/70091; G03F 7/70291; G03F 7/20; G03F 1/24; G03F 7/70308; G03F 7/70566; G03F 1/22; G03F 7/70; G03F 7/70125; G03F 7/70391; G02B 5/09; G02B 26/0833; G02B 5/0891
See application file for complete search history.

(56) References Cited

U.S. PATENT DOCUMENTS

| | | | |
|---|---|---|---|
| 6,452,724 B1 * | 9/2002 | Hansen | F21V 9/14 359/485.05 |
| 6,999,172 B2 | 2/2006 | Masaki et al. | |
| 2003/0081210 A1 | 5/2003 | Masaki et al. | 356/369 |
| 2004/0061930 A1 | 4/2004 | Wedowski | |
| 2008/0192225 A1 | 8/2008 | Mann et al. | |
| 2011/0063597 A1 | 3/2011 | Mengel | |
| 2011/0122392 A1 | 5/2011 | Fiolka et al. | |
| 2012/0162627 A1 | 6/2012 | Fiolka et al. | |
| 2012/0206704 A1 | 8/2012 | Wangler et al. | |

FOREIGN PATENT DOCUMENTS

| | | |
|---|---|---|
| CN | 101952779 A | 1/2011 |
| CN | 102549461 A | 7/2012 |
| DE | 10 2008 002 749 A1 | 12/2009 |
| DE | 10 2008 041 801 A1 | 3/2010 |
| DE | 102013200137 | 11/2013 |
| DE | 102013202645 | 2/2014 |
| DE | 102012219936 | 4/2014 |
| DE | 102013205957 | 4/2014 |
| EP | 1 356 476 B1 | 8/2006 |
| GB | 2408588 A | 6/2005 |
| JP | 2010-256637 A | 11/2010 |
| WO | WO 2006/111319 A2 | 10/2006 |
| WO | WO 2014/067812 | 5/2014 |

OTHER PUBLICATIONS

International Preliminary Report on Patentability for corresponding International Application No. PCT/EP2013/075383, 7 pages, mailed Jun. 25, 2015.
German Office Action with English translation thereof for corresponding German Application No. 10 2012 223 233.8, 9 pages, dated Jun. 24, 2013.
International Search Report and Written Opinion for corresponding PCT Appl No. PCT/EP2013/075383, mailed Apr. 28, 2014.
Taiwanese Office Action and Search Report, with translation thereof, for corresponding TW Appl No. 102146156, dated Mar. 14, 2017.

* cited by examiner

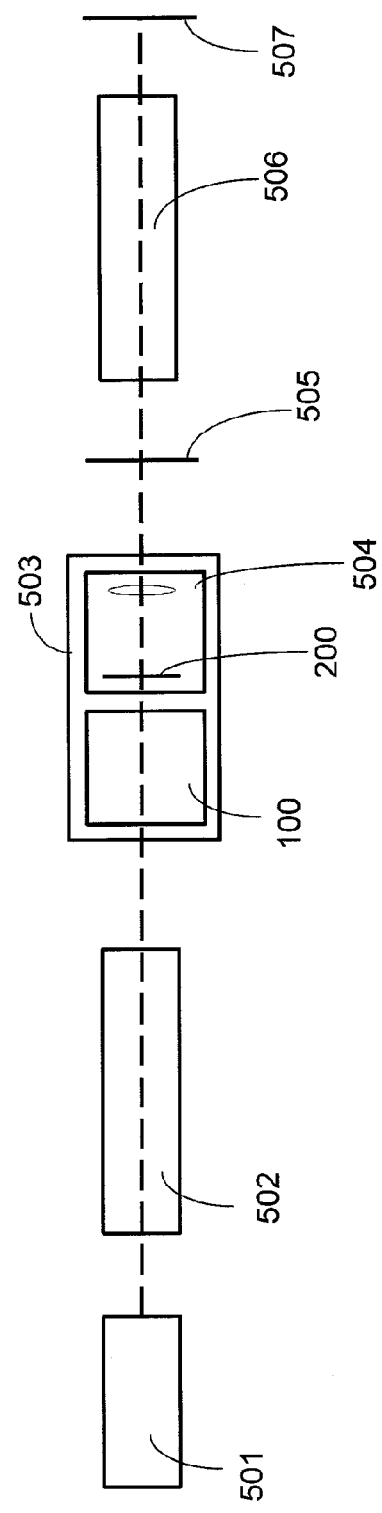

OPTICAL SYSTEM OF A MICROLITHOGRAPHIC PROJECTION EXPOSURE APPARATUS

CROSS REFERENCE TO RELATED APPLICATIONS

This application is a continuation of, and claims benefit under 35 USC 120 to, international application PCT/EP2013/075383, filed Dec. 3, 2013, which claims benefit under 35 USC 119 of German Patent Application DE 10 2012 223 233.8 and U.S. 61/737,153, both filed on Dec. 14, 2012. The content of these applications is hereby incorporated by reference.

BACKGROUND OF THE INVENTION

Field of the Invention

The invention relates to an optical system of a microlithographic projection exposure apparatus.

Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

During the operation of a projection exposure apparatus, there is a need to set, in the illumination device, for the purpose of optimizing the imaging contrast, in a targeted manner, specific polarization distributions in the pupil plane and/or in the reticle and also to be able to make a change to the polarization distribution during the operation of the projection exposure apparatus.

With regard to the prior art with respect to changing the polarization distribution in projection exposure apparatuses designed for the EUV range, reference is made merely by way of example to DE 10 2008 002 749 A1, US 2008/0192225 A1, WO 2006/111319 A2 and U.S. Pat. No. 6,999,172 B2.

SUMMARY OF THE INVENTION

It is an object of the present invention to provide an optical system of a microlithographic projection exposure apparatus in particular for operating in the EUV, which enables a flexible setting of the polarization distribution in the projection exposure apparatus.

This object is achieved in accordance with an optical system of a microlithographic projection exposure apparatus, in particular for operation in the EUV, that includes: a mirror arrangement composed of a plurality of mutually independently adjustable mirror elements; and at least one polarization-influencing arrangement arranged upstream of the mirror arrangement relative to the light propagation direction. The polarization-influencing arrangement has a group of first reflection surfaces and a group of second reflection surfaces. The first reflection surfaces are tiltable independently of one another. During the operation of the optical system, light reflected at respectively one of the first reflection surfaces can be directed onto the mirror arrangement via respectively a different one of the second reflection surfaces depending on the tilting of the first reflection surface.

An optical system according to the invention of a microlithographic projection exposure apparatus, in particular for operation in the EUV, comprises:
- a mirror arrangement composed of a plurality of mutually independently adjustable mirror elements; and
- at least one polarization-influencing arrangement arranged upstream of the mirror arrangement relative to the light propagation direction;
- wherein the polarization-influencing arrangement has a group of first reflection surfaces and a group of second reflection surfaces;
- wherein the first reflection surfaces are tiltable independently of one another, and wherein, during the operation of the optical system, light reflected at respectively one of the first reflection surfaces can be directed onto the mirror arrangement via respectively a different one of the second reflection surfaces depending on the tilting of the first reflection surface.

In accordance with one embodiment, the first reflection surfaces are tiltable in each case independently of one another about in each case two mutually perpendicular tilting axes. Furthermore, in accordance with one embodiment, during the operation of the optical system, light is incident on respectively one of the first reflection surfaces and/or of the second reflection surfaces in each case with an angle of incidence $\Theta = \Theta_B \pm 5°$, wherein $\Theta_B$ denotes the Brewster angle for the reflection surfaces at an operating wavelength of the optical system.

The invention is based on the concept, in particular, of generating, from originally unpolarized or circularly polarized input light (in particular EUV light), linearly polarized output light having a different polarization direction by virtue of the fact that the light can be directed in a polarization-influencing arrangement via respectively one from a group of mutually tiltable first reflection surfaces and via respectively one from a group of second reflection surfaces onto a mirror arrangement. In this case, a linear polarization having a desired polarization direction is set respectively for the emerging light via two successive reflections, at least one of which takes place substantially at the Brewster angle.

On account of the reflection taking place at the respective reflection surface at the Brewster angle, the respective light reflected by the polarization-influencing arrangement is linearly polarized (s-polarized relative to the respective reflection surface), wherein the polarization direction within the optical system is dependent on the orientation of the respective reflection surface (that is to say, in the case of the first reflection surfaces, dependent on the axis about which the tilting thereof respectively takes place). The Brewster angle in an EUV system is typically approximately 43° (since the refractive index of all appropriate layer materials at EUV wavelengths of less than 15 nm is close to the value 1). Consequently, in the polarization-influencing arrangement according to the invention, the polarization direction of the light rays incident on the second reflection surfaces and emerging from the latter can be varied by the fact that the first reflection surfaces are tiltable independently of one another (in particular about in each case two mutually perpendicular tilting axes), such that a respective different one of the second reflection surfaces is selected as a result of the different tilting of respectively one of the first reflection surfaces, as a result of which at the same time different polarization directions of the linear polarization generated in each case for this light ray are generated.

In an illumination device comprising the optical system according to the invention, it is possible as a result, as explained in even greater detail here, proceeding from a coherent light source having a low etendue (e.g. a synchrotron or a free electron laser), to span a field which has the same shape or the same aspect ratio as the illumination field generated at the location of the mirror arrangement or ultimately also in the reticle plane. From the field which is initially spanned in the illumination device and in which the light is preferably unpolarized or circularly polarized, via targeted selection of successive reflections at the first and respectively second reflection surfaces within the polarization-influencing arrangement, a plurality of individual fields having a linear polarization having a different polarization direction are generated, which are in turn combined at the location of the mirror arrangement, whereupon the mirror arrangement is imaged at least approximately into the mask plane via downstream optical elements (in the simplest case a concave mirror). Furthermore, the mirror arrangement can generate a correspondingly desired intensity and polarization distribution in the pupil plane via the targeted angular position of the individual mirrors. In this case, different regions of the mirror arrangement can be illuminated with a different polarization direction.

Within the meaning of the present application, the term "reflection surfaces" should be considered to encompass partly transmissive surfaces as well, as will be described in even greater detail below.

In accordance with one embodiment, during the operation of the optical system, a light ray reflected by respectively one of the second reflection surfaces is reflected in an output direction, which is approximately parallel to the direction of incidence of the light ray before the preceding reflection at the respective first reflection surface. In this case, in accordance with one embodiment, during the operation of the optical system, a light ray reflected by respectively one of the second reflection surfaces is reflected in an output direction, which deviates by a maximum of ±15°, in particular by a maximum of ±10°, more particularly by a maximum of ±5°, from the direction of incidence of the light ray before the preceding reflection at the respective first reflection surface. In this case, a slight tilting of the output direction is preferably provided in order to combine the light beams emerging from the second reflection surfaces on the mirror arrangement at the finite distance.

In accordance with one embodiment, the polarization-influencing arrangement converts light incident on the respective first reflection surfaces during the operation of the optical system into linearly polarized light emerging from the respective second reflection surface. In this case, the electric light vector of the linearly polarized light emerging from the respective second reflection surface is substantially perpendicular to the plane defined by the direction of incidence and the direction of reflection of the light at the first reflection surface.

In accordance with one embodiment, the light incident on the respective first reflection surfaces during the operation of the optical system is unpolarized or circularly polarized. However, the invention is not restricted to the conversion of unpolarized or circularly polarized light into linearly polarized light. In further embodiments or applications, the invention can also be used in conjunction with light incident in a linearly polarized manner. In this case, as described below, the tiltability of the first reflection surfaces can also be used to direct the original polarization state into the pupil plane without being changed and without reflection losses at the first reflection surfaces or second reflection surfaces.

The group of first reflection surfaces can be embodied in particular as a strip mirror unit having a plurality of mutually independently adjustable strip mirrors. However, the invention is not restricted to a strip-shaped geometry of the first reflection surfaces, and so the reflection surfaces can also have other suitable geometries depending on the concrete optical design.

In accordance with one embodiment, the group of second reflection surfaces is configured such that it completely illuminates the mirror arrangement during the operation of the optical system, wherein mutually different regions of the mirror arrangement can be illuminated with light emerging from different second reflection surfaces and with a different polarization direction.

In accordance with one embodiment, the polarization-influencing arrangement, in at least one setting of the first reflection surfaces, leaves unchanged the polarization state of light passing through the optical system. In this case, in particular the first reflection surfaces can be "swung out" from the optical beam path in such a way that the illumination light generated (e.g. by a light source that generates unpolarized light) passes without reflection at the first or second reflection surfaces—and thus also without intensity losses associated with such reflections—with an unchanged polarization state into the pupil plane.

In accordance with one embodiment the polarization-influencing arrangement generates an at least approximately tangential polarization distribution or an at least approximately radial polarization distribution in a pupil plane of the optical system. "Tangential polarization" (or "TE polarization"), which enables high-contrast imaging in a manner known per se, is understood to mean a polarization distribution for which the oscillation planes of the electric field strength vectors of the individual linearly polarized light rays are oriented approximately perpendicularly to the radius directed to the optical system axes. "Radial polarization" (or "TM polarization") is understood to mean a polarization distribution for which the oscillation planes of the electric field strength vectors of the individual linearly polarized light rays are oriented approximately radially with respect to the optical system axis. An "at least approximately" tangential or radial polarization distribution is understood to mean a polarization distribution for which the above condition is fulfilled approximately (for instance in a quadrupole or dipole illumination setting in which illumination poles situated opposite one another in the x-direction are y-polarized and/or illumination poles situated opposite one another in the y-direction are x-polarized).

In accordance with a further aspect, the invention relates to an illumination device of a microlithographic projection exposure apparatus designed for operation in the EUV, wherein the illumination device comprises an optical system having the features described above.

The invention furthermore relates to a microlithographic projection exposure apparatus comprising an illumination device and a projection lens, wherein the illumination device comprises an optical system having the features described above, and to a method for microlithographically producing microstructured components.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 5 shows a schematic illustration for elucidating the possible construction of a microlithographic projection exposure apparatus in which the present invention can be realized.

DETAILED DESCRIPTION OF PREFERRED EMBODIMENTS

Figure 1:
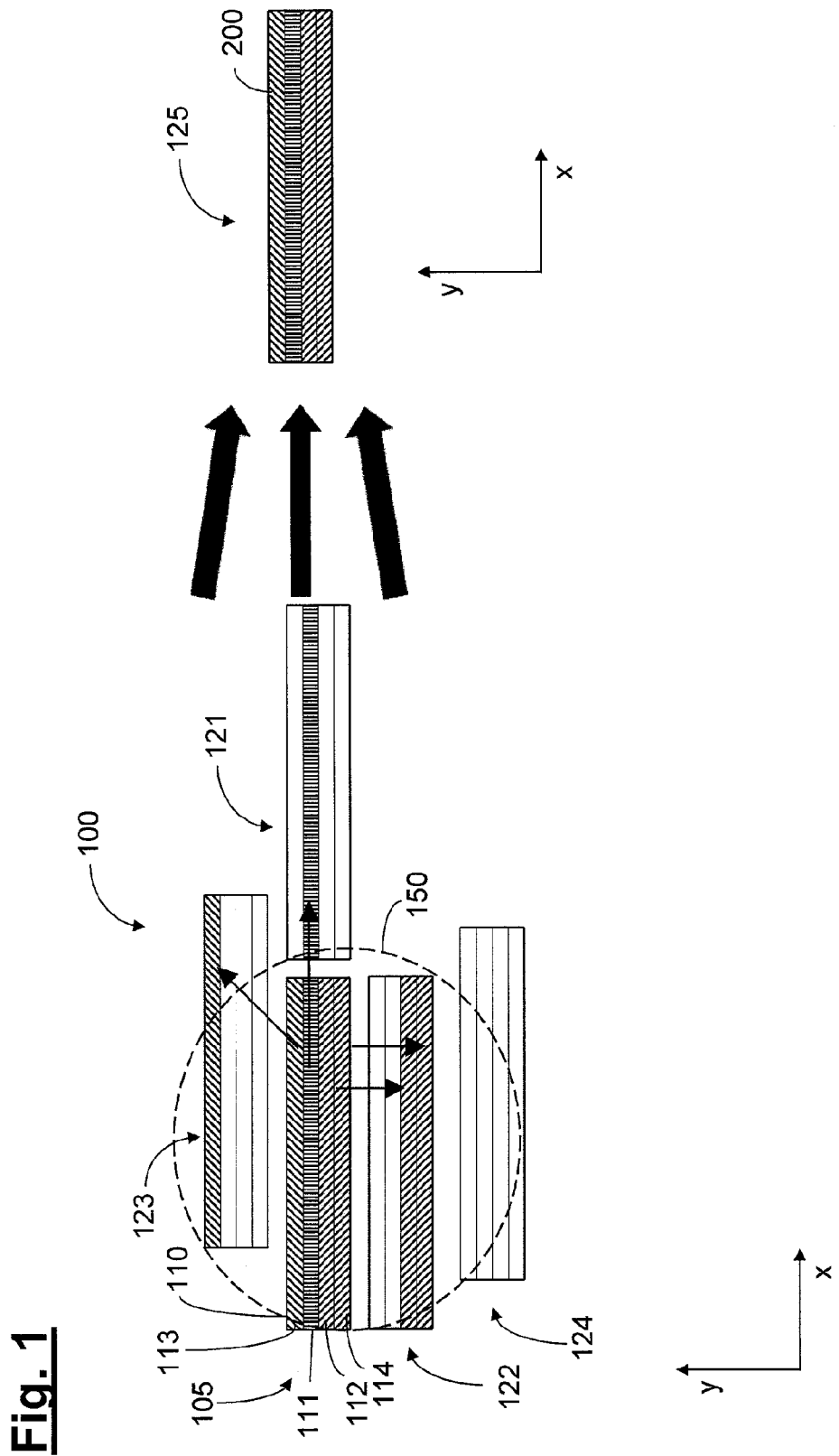
FIG. 1 shows a schematic illustration for elucidating the principle underlying the present invention.
Figure 2:
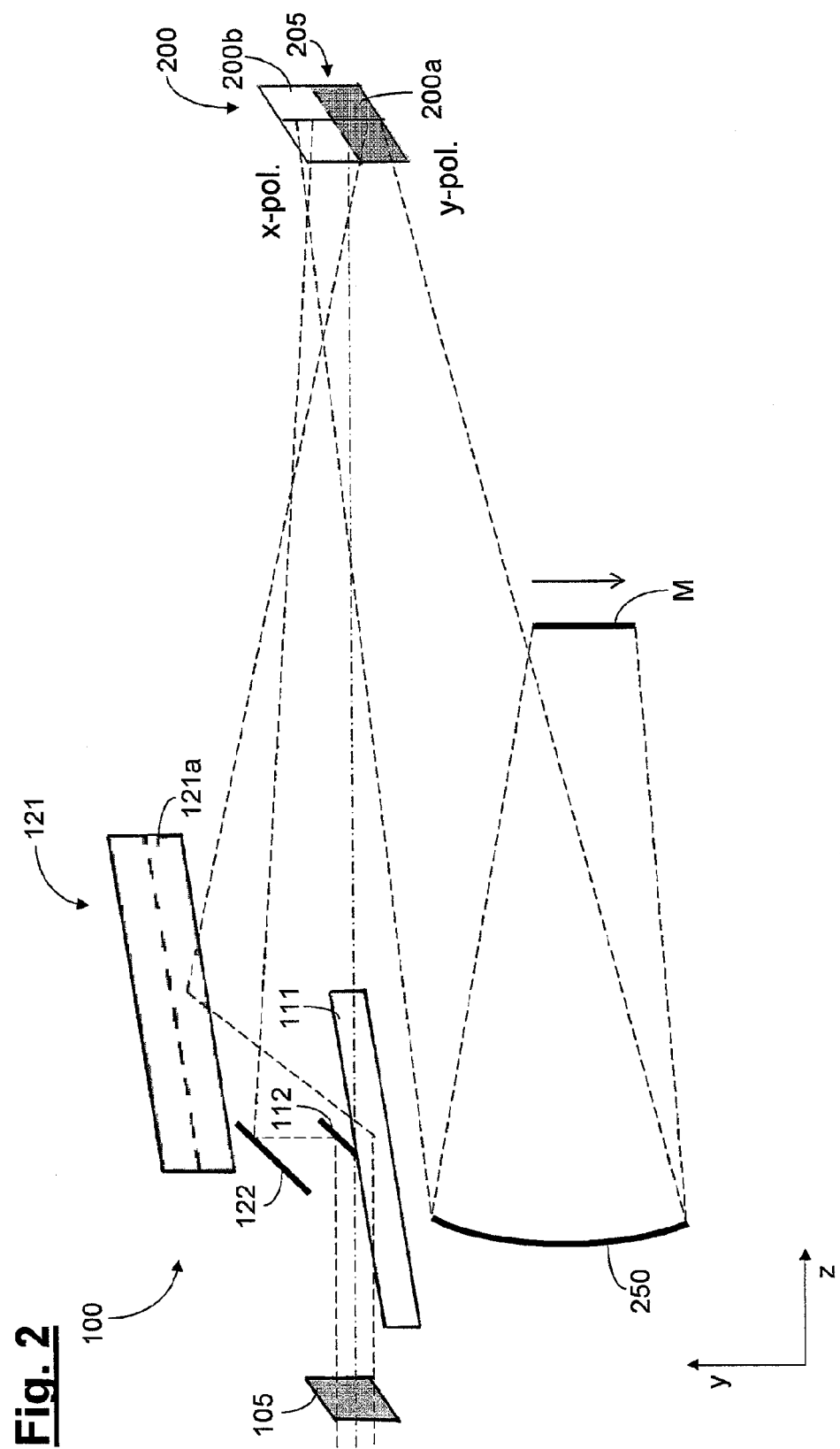
FIG. 2 shows a schematic illustration for elucidating one fundamentally possible construction of an illumination device of a projection exposure apparatus designed for operation in the EUV.

FIGS. 1 and 2 show schematic illustrations for elucidating an exemplary embodiment of an optical system according to the invention in an illumination device.

Figure 3:
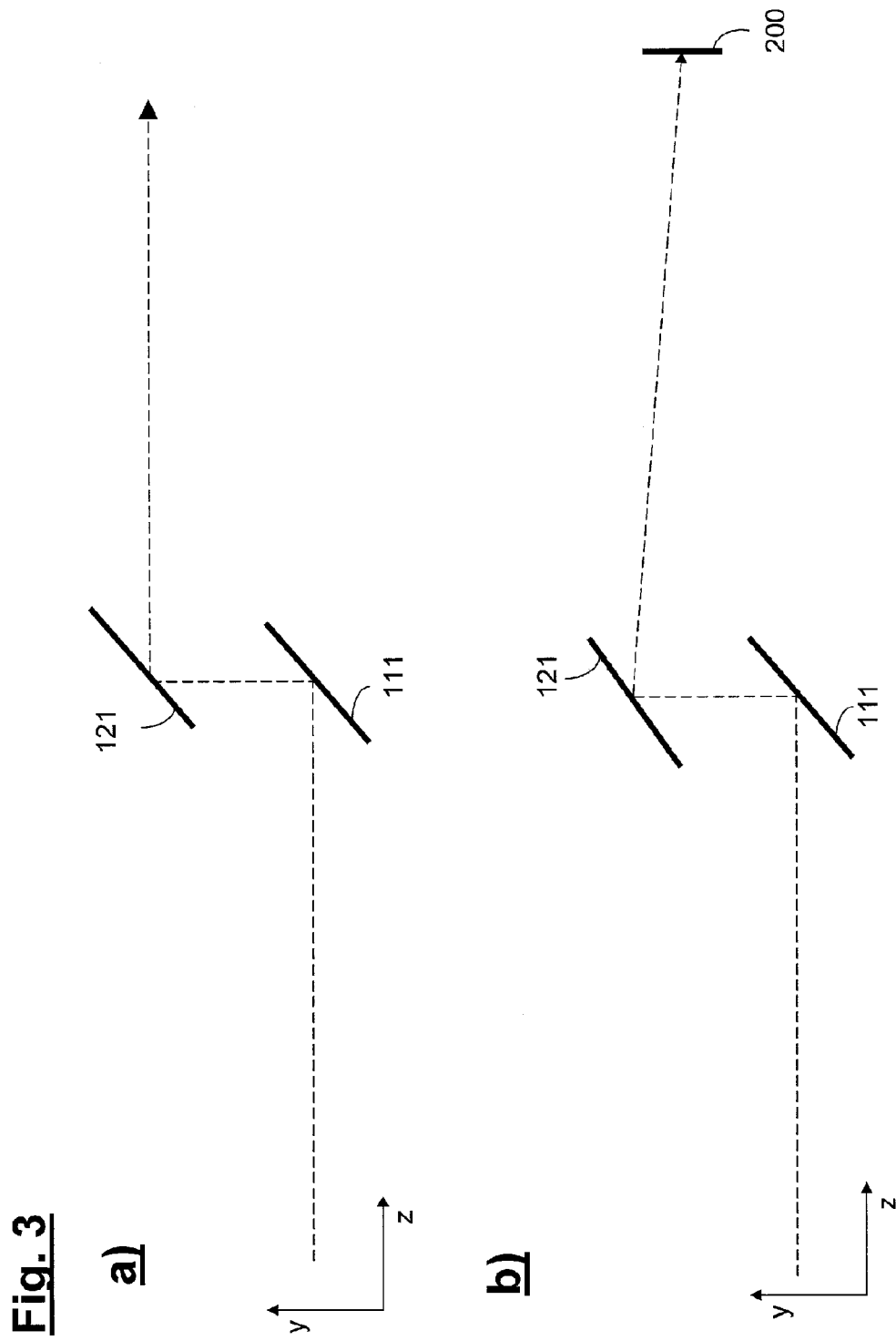
FIGS. 3a-b show further schematic illustrations for elucidating the principle underlying the present invention.

The principle underlying the present invention is firstly elucidated below with reference to FIG. 1 and FIG. 3.

In accordance with FIG. 1, light from a coherent light source (not shown) is firstly incident on a polarization-influencing arrangement 100, which will be explained in greater detail below, in the z-direction relative to the coordinate system depicted. The light source preferably generates a small etendue close to the value of zero, wherein the light source can be, for example, a synchrotron or a free electron laser. Furthermore, use is preferably made of a light source which uses either unpolarized light or circularly polarized light, such that the light generated by the light source does not have a distinguished preferred direction of polarization.

The polarization-influencing arrangement 100 has, as illustrated merely schematically and in a greatly simplified manner in FIG. 1, a first group of first reflection surfaces 111, 112, . . . , which in the exemplary embodiment is embodied as a strip mirror unit 110 having a plurality of mutually independently adjustable strip mirrors. The strip mirrors or first reflection surfaces 111, 112, . . . are tiltable in each case about two mutually perpendicular tilting axes (which run in the x- and y-directions in the exemplary embodiment), such that the light reflected at the strip mirrors or first reflection surfaces 111, 112, . . . can be reflected into different solid angles, which can be set in any desired manner, in principle, depending on the tilting of the respective strip mirror.

In order that the input polarization state—which is preferably unpolarized or circularly polarized as described in the introduction—of the light incident on the first reflection surfaces 111, 112, . . . is converted into linear polarization having a differently selectable polarization direction, the strip mirrors or first reflection surfaces 111, 112, . . . are tilted in each case about an arbitrary desired axis (e.g. the x-axis, the y-axis or else the angle bisector between x-axis and y-axis) in such a way that the light incident on the respective first reflection surface 111, 112, . . . is incident at the Brewster angle (applicable to the relevant operating wavelength), wherein the Brewster angle for the wavelengths in the EUV envisaged in particular according to the invention is approximately 43°. One suitable HR layer material which can be used at the first and second reflection surfaces in the EUV is, for example, MoSi (i.e. alternating molybdenum-silicon layers on a silicon substrate).

The polarization-influencing arrangement 100 furthermore has a group of second reflection surfaces 121, 122, . . . , which are arranged all around the strip mirror unit 110, as indicated schematically in FIG. 1, such that the light reflected at the strip mirrors or first reflection surfaces 111, 112, . . . can be directed onto respectively a different one of the second reflection surfaces 121, 122, . . . depending on the tilting angles of the first reflection surfaces.

On account of the reflections taking place at the Brewster angle at the first reflection surfaces 111, 112, . . . , s-polarized light relative to the reflection surfaces is reflected to the greatest possible extent, whereas p-polarized light relative to the reflection surfaces is transmitted to the greatest possible extent or absorbed in the material. Consequently, the light reflected at the relevant first reflection surface 111, 112, . . . is s-polarized relative to the respective first reflection surface and is then incident on that second reflection surface 121, 122, . . . , which has approximately the same orientation as the just set orientation of the respective first reflection surface 111, 112, . . . . As a result, the light reflected at the second reflection surface 121, 122, . . . propagates approximately parallel to the respective propagation direction before incidents on the respective first reflection surface 111, 112, . . . , but is now linearly polarized, wherein the polarization direction of this linear polarization is dependent on the orientation of the relevant second and first reflection surfaces at which the light was reflected.

In other words, the combined effect of second and first reflection surfaces, as indicated merely schematically in FIG. 3a, alongside the linear polarization having a respectively desired polarization direction, leads only to an offset of the respective light beam, without an additional angle with respect to the original light propagation direction being introduced.

The illustration in FIG. 3a, which facilitates understanding, is not complied with exactly in the practical design of the system. In actual fact, preferably in accordance with FIG. 3b the respective second reflection surface 121 is slightly tilted in order to combine the light beams on the mirror arrangement. However, since this angle substantially lies in the plane spanned by the incident and reflected light beams, the desired polarization state is not impaired thereby.

FIG. 2 (corresponding to a section in the y-z plane) serves for elucidating the arrangement of the second reflection surfaces 121, 122, . . . relative to the strip mirrors or first reflection surfaces 111, 112, . . . , wherein only two strip mirrors or first reflection surfaces 111 and 112 and also only two second reflection surfaces 121, 122 are illustrated in FIG. 2 for reasons of simpler and clearer illustration. In comparison with the schematic illustration in FIG. 1 containing in each case four first reflection surfaces 111-114 and four second reflection surfaces 121-124, only half the number of reflection surfaces is therefore illustrated in FIG. 2.

The illustration in FIG. 1 is also greatly simplified insofar as, in principle, an arbitrary number of first reflection surfaces 111, 112, . . . and/or second reflection surfaces 121, 122, . . . can be provided, wherein the light can also be directed in each case in groups by a plurality of strip mirrors or first reflection surfaces 111, 112, . . . onto one and the same second reflection surface 121, 122, . . . , since those strip mirrors or first reflection surfaces 111, 112, . . . , which have the same orientation illuminate one and the same second reflection surface 121, 122, . . . stripwise.

Merely by way of example (but without the invention being restricted thereto) the strip mirror unit 110 can contain twenty to forty strip mirrors, for example, of which (likewise merely by way of example) four to eight second reflection surfaces 121, 122, . . . can be "addressed" in the manner described above (which should be understood to mean that the light is directed onto the relevant second reflection surface, that is to say that the latter is "selected" by the relevant first reflection surface).

As can be seen from FIG. 1, FIG. 2 and FIG. 3b, after reflection at the second reflection surfaces 121, 122, . . . the individual light beams are incident on a mirror arrangement 200 in the form of an MMA (="Micro Mirror Array") having (in a typically matrix-like construction) a plurality of mutually independently adjustable mirror elements (in particular tiltable in turn about two mutually perpendicular tilting axes). In this case, the mirror arrangement 200 is preferably completely illuminated overall by the group of second reflection surfaces 121, 122, . . . , each of the second reflection surfaces 121, 122, . . . in turn being illuminated by those first reflection surfaces 111, 112, . . . which are oriented at a corresponding tilting angle. In the specific exemplary embodiment, the lower region 200a of the mirror arrangement 200 in FIG. 2 is illuminated in a y-polarized manner (i.e. with light which is linearly polarized in the y-direction and which emerges from the region 121a of the reflection surface 121) and the upper region 200b of the mirror arrangement 200 is illuminated in an x-polarized manner (i.e. with light which is linearly polarized in the x-direction and which emerges from the reflection surface 122).

The mirror elements of the mirror arrangement 200 fulfill two tasks in the optical system according to the invention:

Firstly, each mirror element of the mirror arrangement 200, depending on its respective tilting position, selects one of the second reflection surfaces 121, 122, . . . (and at the same time a specific polarization direction of the linear polarization respectively generated).

Secondly, the relevant mirror element of the mirror arrangement 200 directs the light incident on the mirror arrangement 200 from the respective second reflection surface 121, 122, . . . with the selected polarization direction onto a desired location in the pupil plane of the optical system in accordance with a predefined intensity distribution or a desired illumination setting.

Via the mutually independently adjustable individual mirrors of the mirror arrangement 200, flexible pupil shaping can be realized by the light rays that are incident on the individual mirrors of the mirror arrangement 200 being directed in each case onto a desired location in a downstream pupil plane of the optical system. In this case, the mirror elements of the mirror arrangement 200 overall can in principle address any arbitrary point in the pupil plane (and so "pupil quantization" in the sense of pupil illumination that is possible only in fixed steps or grids is not present). A high flexibility of the pupil illumination is made possible in conjunction with the small etendue of the source.

The invention is not restricted to the arrangement—chosen in the exemplary embodiment described—of the mirror arrangement in a plane that is conjugate with respect to the field plane. In further exemplary embodiments, it is also possible to choose a different use or functioning of the mirror arrangement in the illumination system. By way of example, the mirror arrangement can also be used with a concept similar to a fly's eye condenser, as described in US 2012/0206704 A1.

In accordance with FIG. 2, the light emerging from the mirror arrangement 200 is directed via a mirror 250 onto a reticle plane containing the mask M or the reticle, wherein the above-mentioned pupil plane can be situated merely by way of example on the mirror 250 or else in an arbitrary other position (for example also in the front focal plane of the mirror 250).

In the optical system according to the invention (referring to FIG. 2 again) as a result in particular proceeding from the originally coherent light source having a small etendue, a field 105 is spanned which has the same shape or the same aspect ratio as the illumination field 125 generated at the location of the mirror arrangement 200 (or alternately also in the reticle plane). From the initially spanned field 105, which is preferably unpolarized or circularly polarized, therefore, via targeted selection of successive reflections at the first and respectively the second reflection surfaces within the polarization-influencing arrangement 100, a plurality of individual fields having linear polarization having a different polarization direction (corresponding to the second reflection surfaces) are generated, which are in turn combined at the location of the mirror arrangement 200, which generates a corresponding desired intensity and polarization distribution in the pupil plane.

The polarization distribution can be in particular (without the invention being restricted thereto) an at least approximately tangential polarization distribution, which enables high-contrast imaging in a manner known per se. The polarization distribution can furthermore also be, for example, an at least approximately radial polarization distribution.

In order to elucidate the tilting angle range respectively required or adjustable for the individual mirror elements of the mirror arrangement 200, reference is again made to FIG. 1 below.

As indicated by the dashed curve 150 depicted by way of example in FIG. 1, one and the same position within every second reflection surface 121, 122, . . . (in the example the position situated in each case in the top left corner of the second reflection surfaces 121, 122, . . . ) can be addressed by a respective mirror element of the mirror arrangement 200 which is situated at the corresponding position (i.e. in the example in turn in the top left corner) within the mirror arrangement 200. In other words, each mirror element of the mirror arrangement 200 is able, depending on the tilting position, to capture the reflected light from the respectively corresponding position from each of the second reflection surfaces 121, 122, . . . and to direct it onto the desired position in the pupil plane.

The invention is not restricted to the generation of linear polarization (with possibly varying polarization direction) in the pupil plane. Rather, e.g. in an application in which unpolarized light is desired in the pupil plane, the tiltability of the first reflection surfaces 111, 112, . . . or of the strip mirrors can also be used to "swing out" the first reflection surfaces 111, 112, . . . from the optical beam path in such a way that the illumination light generated (e.g. by a light source that generates unpolarized light) passes with an unchanged polarization state, that is to say in particular without reflection at the first or second reflection surfaces, onto the mirror arrangement 200, in which case the intensity losses otherwise associated with the reflections at the first or second reflection surfaces can then also be avoided.

Furthermore, the tiltability of the first reflection surfaces 111, 112, . . . can also be used to direct a different original polarization state (e.g., depending on the light source used, also circular polarization or else a constant linear polarization) with an unchanged polarization state and without reflection losses at the first reflection surfaces 111, 112, . . . or second reflection surfaces 121, 122, . . . onto the mirror arrangement 200.

Figure 4:
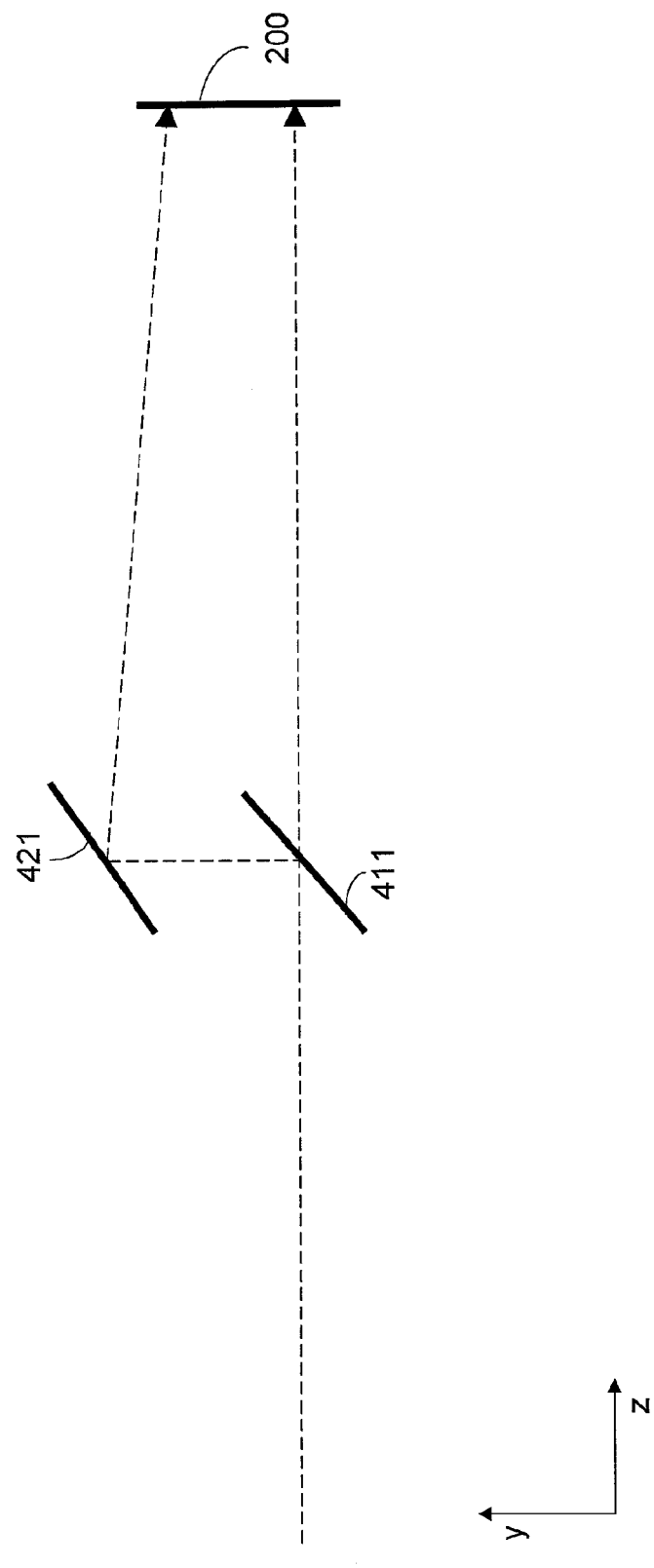
FIG. 4 shows a schematic illustration for elucidating a further embodiment of the invention.

The invention is not restricted to (almost) complete reflection at the first reflection surfaces 111, 112, . . . . In further embodiments, the first reflection surfaces 111, 112, . . . can also be configured in such a way they transmit a significant proportion (which, merely by way of example, can be of the order of magnitude of 70%) of the incident EUV radiation, as is indicated merely schematically in FIG. 4 for a partly tranmsissive first reflection surface 411. In this case, light having an orthogonal polarization direction relative to the reflected proportion propagates along the original direction of incidence and can likewise be used depending on the desired polarized illumination setting (for instance for generating a quadrupole illumination setting with "x-y polarization" in which illumination poles situated opposite one another in the x-direction are y-polarized and illumination poles situated opposite one another in the y-direction are x-polarized), such that the light loss overall is reduced as a result.

In this case, the corresponding partly transmissive reflection surfaces can be realized for example by zirconium films (the thickness of which, merely by way of example, can be approximately 50 μm). The use of zirconium films in EUV lithography is known e.g. from EP 1 356 476 B1 and DE 10 2008 041 801 A1 for realizing spectral filters for the purpose of filtering out undesired components of the electromagnetic radiation, wherein, as described in EP 1 356 476 B1, in order to prevent oxidation of the zirconium material, the zirconium film can also be arranged between two silicon layers. Furthermore, an MoSi coating for increasing the reflectivity is possible.

FIG. 5 serves as a merely schematic and simplified illustration for elucidating the possible construction of a microlithographic projection exposure apparatus in which the invention can be realized.

In accordance with FIG. 5, light from a coherent light source 501 (e.g. a synchrotron or a free-electron laser) is incident via an optical beam guiding and expanding unit 502 on an illumination device 503, which comprises, as described above, the polarization-influencing arrangement 100 according to the invention and—in an optical unit 504 for pupil generation—the mirror arrangement 200 situated in an intermediate field plane. A mask (reticle) 505 illuminated by the illumination device is situated in the object plane of a downstream projection lens 506 which images the structures on the mask 505 onto a wafer 507 arranged in the image plane.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention and the scope of the invention is restricted only within the meaning of the accompanying patent claims and the equivalents thereof.

The invention claimed is:

1. An optical system, comprising:
a mirror arrangement comprising a plurality of mutually independently adjustable mirror elements; and
a polarization-influencing arrangement upstream of the mirror arrangement along a path light follows through the optical system during use of the optical system, wherein:
the polarization-influencing arrangement comprises a group of first reflection surfaces and a group of second reflection surfaces;
the first reflection surfaces are tiltable independently of one another;
the optical system is configured so that, during the use of the optical system, light reflected at a first reflection surface is directed onto the mirror arrangement via a second reflection surface depending on a tilt of the first reflection surface;
the optical system has a pupil plane;
the mirror arrangement is upstream of the pupil plane; and
the optical system is a microlithographic optical system.

2. The optical system of claim 1, wherein the first reflection surfaces are tiltable independently of each other about two mutually perpendicular tilting axes.

3. The optical system of claim 1, wherein, during use of the optical system, light is incident on the first reflection surface at an angle of incidence which is ±5° relative to the Brewster angle for the first reflection surface at an operating wavelength of the optical system.

4. The optical system of claim 3, wherein, during use of the optical system, light is incident on the second reflection surface at an angle of incidence which is ±5° relative to the Brewster angle for the second reflection surfaces at an operating wavelength of the optical system.

5. The optical system of claim 1, wherein, during use of the optical system, light is incident on the second reflection surface at an angle of incidence which is ±5° relative to the Brewster angle for the second reflection surface at an operating wavelength of the optical system.

6. The optical system of claim 1, wherein, during use of the optical system, a light ray is reflected by the second reflection surface in an output direction which deviates by a maximum of ±15° from a direction of incidence of the light ray on the first reflection surface.

7. The optical system of claim 1, wherein, during use of the optical system, a light ray is reflected by the second reflection surface in an output direction which deviates by a maximum of ±10° from a direction of incidence of the light ray on the first reflection surface.

8. The optical system of claim 1, wherein, during use of the optical system, a light ray is reflected by the second reflection surface in an output direction which deviates by a maximum of ±5° from a direction of incidence of the light ray on the first reflection surface.

9. The optical system of claim 1, wherein the polarization-influencing arrangement is configured so that, during use of the optical system, the light incident on the first reflection surface emerges from the second reflection surface as linearly polarized light.

10. The optical system of claim 9, wherein, during use of the optical system, light incident on the first reflection surface is unpolarized.

11. The optical system of claim 9, wherein, during use of the optical system, light incident on the first reflection surface is circularly polarized.

12. The optical system of claim 1, wherein the group of first reflection surfaces comprises a strip mirror unit comprising a plurality of mutually independently adjustable strip mirrors.

13. The optical system of claim 1, wherein the first reflection surfaces are partly transmissive to light at an operating wavelength of the optical system.

14. The optical system of claim 1, wherein the group of second reflection surfaces is configured so that, during use of the optical system, the group of second reflection surfaces completely illuminates the mirror arrangement.

15. The optical system of claim 1, wherein the polarization-influencing arrangement is configured to that, during use of the optical system, the first reflection surfaces do not change a polarization state of the light passing through the optical system.

16. The optical system of claim 1, wherein the polarization-influencing arrangement is configured so that, during use of the optical system, the polarization-influencing arrangement generates an at least approximately tangential polarization distribution in the pupil plane of the optical system.

17. The optical system of claim 1, wherein the polarization-influencing arrangement is configured so that, during use of the optical system, the polarization-influencing arrangement generates an at least approximately radial polarization distribution in the pupil plane of the optical system.

18. An illumination device, comprising:
an optical system according to claim 1,
wherein the illumination device is an EUV microlithographic illumination device.

19. An apparatus, comprising:
an illumination device comprising an optical system according to claim 1; and
a projection lens,
wherein the apparatus is an EUV microlithographic projection exposure apparatus.

20. A method of operating a microlithographic projection exposure apparatus comprising an illumination device and a projection lens, the method comprising:
using the illumination system to illuminate structures of a mask; and
using the projection lens to project the illuminated structures of the mask onto a light-sensitive material,
wherein the illumination device comprises an optical system according to claim 1.

21. The optical system of claim 1, wherein:
the optical system is configured so that, during use of the optical system, the optical system illuminates a reticle in an object plane; and
the mirror arrangement is in a field plane that is conjugate to the object plane.

22. An optical system, comprising:
a mirror arrangement comprising a plurality of mutually independently adjustable mirror elements; and
a polarization-influencing arrangement upstream of the mirror arrangement along a path light follows through the optical system during use of the optical system,
wherein:
the polarization-influencing arrangement comprises a group of first reflection surfaces and a group of second reflection surfaces;
the first reflection surfaces are tiltable independently of one another;
the optical system is configured so that, during the use of the optical system, light reflected at a first reflection surface is directed onto the mirror arrangement via a second reflection surface depending on a tilt of the first reflection surface;
the optical system is configured so that, during use of the optical system, the optical system illuminates a reticle in an object plane;
the mirror arrangement is in a field plane that is conjugate to the object plane; and
the optical system is a microlithographic optical system.

23. An optical system, comprising:
a mirror arrangement comprising a plurality of mutually independently adjustable mirror elements; and
a polarization-influencing arrangement upstream of the mirror arrangement along a path light follows through the optical system during use of the optical system,
wherein:
the polarization-influencing arrangement comprises a group of first reflection surfaces and a group of second reflection surfaces;
the first reflection surfaces are tiltable independently of one another;
the optical system is configured so that, during the use of the optical system;
light impinges on a first reflection surface then is reflected by the first reflection surface then impinges on a second reflection surface depending on a tilt of the first reflection surface then is reflected by the second reflection surface then impinges on the mirror arrangement and then is reflected by the mirror arrangement;
the light that impinges on the first reflection surface has a first polarization distribution;
the light that impinges on the second reflection surface has a second polarization distribution different from the first polarization distribution; and
the light that impinges on the mirror arrangement has a third polarization distribution different from both the first polarization distribution and the second polarization distribution; and
the optical system is a microlithographic optical system.

24. The optical system of claim 23, wherein the second polarization distribution is more s-polarized than the first polarization distribution.

25. The optical system of claim 24, wherein the third polarization distribution is more s-polarized than the second polarization distribution.

26. The optical system of claim 25, wherein the third polarization distribution is a linear polarization distribution.

* * * * *

UNITED STATES PATENT AND TRADEMARK OFFICE
CERTIFICATE OF CORRECTION

| | | |
|---|---|---|
| PATENT NO. | : 9,720,327 B2 | Page 1 of 1 |
| APPLICATION NO. | : 14/721426 | |
| DATED | : August 1, 2017 | |
| INVENTOR(S) | : Manfred Maul | |

It is certified that error appears in the above-identified patent and that said Letters Patent is hereby corrected as shown below:

In the Specification

Column 9, Line 12, delete "tranmsissive" and insert -- transmissive --.

In the Claims

Column 11, Line 6, Claim 15, delete "to" and insert -- so --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*